(12) United States Patent
Kang

(10) Patent No.: US 7,833,868 B2
(45) Date of Patent: Nov. 16, 2010

(54) METHOD FOR FABRICATING A SEMICONDUCTOR DEVICE HAVING RECESSED GATE ELECTRODE AND ELEVATED SOURCE AND DRAIN REGIONS

(75) Inventor: Kyung-Doo Kang, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 202 days.

(21) Appl. No.: 12/165,228

(22) Filed: Jun. 30, 2008

(65) Prior Publication Data
US 2009/0023277 A1    Jan. 22, 2009

(30) Foreign Application Priority Data
Jul. 20, 2007    (KR) .................... 10-2007-0072610

(51) Int. Cl.
*H01L 21/336* (2006.01)
*H01L 29/78* (2006.01)
(52) U.S. Cl. ............... 438/300; 438/589; 257/E21.618
(58) Field of Classification Search ............... 438/230, 438/233, 270, 272, 300, 589; 257/E21.618
See application file for complete search history.

(56) References Cited

U.S. PATENT DOCUMENTS

| 5,472,897 | A | * | 12/1995 | Hsu et al. | 438/291 |
| 5,766,998 | A | * | 6/1998 | Tseng | 438/291 |
| 5,899,742 | A | * | 5/1999 | Sun | 438/682 |
| 5,943,564 | A | * | 8/1999 | Chen et al. | 438/202 |
| 5,955,768 | A | * | 9/1999 | Liaw et al. | 257/383 |
| 6,400,002 | B1 | * | 6/2002 | Wu et al. | 257/607 |
| 6,693,026 | B2 | * | 2/2004 | Kim | 438/589 |
| 6,716,046 | B2 | * | 4/2004 | Mistry | 439/270 |
| 2005/0095794 | A1 | * | 5/2005 | Park | 438/296 |
| 2005/0199930 | A1 | * | 9/2005 | Seo et al. | 257/296 |
| 2006/0148174 | A1 | * | 7/2006 | Kim | 438/259 |
| 2009/0023277 | A1 | * | 1/2009 | Kang | 438/589 |

FOREIGN PATENT DOCUMENTS

KR    1020060077542 A    7/2006

\* cited by examiner

*Primary Examiner*—Anh D Mai
(74) *Attorney, Agent, or Firm*—Townsend and Townsend and Crew LLP

(57) ABSTRACT

A method for fabricating a semiconductor device, the method includes forming an isolation layer defining an active region over a substrate, forming a conductive layer over the substrate including the isolation layer, patterning the conductive layer to form a conductive pattern over the active region defined on both sides of a gate region, forming insulation spacers on a sidewall of the conductive pattern, forming a conductive layer for a gate electrode and a gate hard mask layer over the resulting structure including the conductive pattern, and patterning the gate hard mask layer and the conductive layer for the gate electrode to form a gate in the gate region of the substrate.

12 Claims, 4 Drawing Sheets

METHOD FOR FABRICATING A SEMICONDUCTOR DEVICE HAVING RECESSED GATE ELECTRODE AND ELEVATED SOURCE AND DRAIN REGIONS

CROSS-REFERENCE TO RELATED APPLICATIONS

The present invention claims priority of Korean patent application number 10-2007-0072610, filed on Jul. 20, 2007, which is incorporated by reference in its entirety.

BACKGROUND OF THE INVENTION

The present invention relates to a method for fabricating a semiconductor device, and more particularly, to a method for fabricating a semiconductor device including a transistor.

As a semiconductor device becomes highly integrated, a channel length of a cell transistor in a semiconductor device such as a dynamic random access memory (DRAM) is significantly reduced to cause a short channel effect. Hence, a transistor having a three-dimensional channel structure such as a recess gate is adopted in order to increase an effective channel length of the transistor.

The recess gate is formed by etching an active region of a substrate by a predetermined depth and forming the gate inside the recess.

In a semiconductor device such as the DRAM, a landing plug contact (LPC) process is performed after a gate formation process.

The LPC process will now be briefly described. A nitride layer for spacers is formed over a substrate including gates (including recess gates) in order to protect the gates during subsequent self aligned contact (SAC) etching process.

An interlayer insulation layer covering the gates is formed over the nitride layer. A SAC etching process is performed on the interlayer insulation layer and the nitride layer to form an opening exposing an active region of the substrate between the gates.

The opening is filled with a conductive material to form a conductive plug, which will be connected to a bit line or a storage node. In this way, the LPC process is completed.

Such a landing plug contact must be self-aligned with the gates and be able to secure an open margin. However, due to the high integration density of the semiconductor device, a space between the gates is reduced an thus it is difficult to meet the demands at the same time.

More specifically, in the SAC etching process for forming the landing plug contact, the reduction in the space between the gates makes it difficult to completely remove the nitride layer on the bottom of the opening, thus causing a "not open fail" of the landing plug contact.

In order to prevent the "not open fail" of the landing plug contact, an over etching process may be performed by increasing an etching time during the SAC etching process for forming a landing plug contact. In this case, however, a hard mask formed over the uppermost of the gate may be excessively lost causing the SAC fail between the landing plug contact and the gate. In addition, a method for reducing a critical dimension (CD) may be used. However, this method may cause a gate leaning.

Since these limitations occurring during the landing plug contact formation process and greatly reduce the yield of the semiconductor device, there is need for technologies that can prevent the limitations.

SUMMARY OF THE INVENTION

Embodiments of the present invention relate to a method for fabricating a semiconductor device, which can prevent defects generated during a landing plug contact formation process to improve the fabrication yield of the semiconductor device.

In accordance with an aspect of the present invention, there is provided a method for fabricating a semiconductor device. The method includes forming an isolation layer defining an active region over a substrate, forming a conductive layer over the substrate including the isolation layer, patterning the conductive layer to form a conductive pattern over the active region defined on both sides of a gate region, forming insulation spacers on a sidewall of the conductive pattern, forming a conductive layer for a gate electrode and a gate hard mask layer over the resulting structure including the conductive pattern, and patterning the gate hard mask layer and the conductive layer for the gate electrode to form a gate in the gate region of the substrate.

In accordance with another aspect of the present invention, there is provided a method for fabricating a semiconductor device. The method includes forming an isolation layer defining an active region over a substrate, forming a first conductive layer over the substrate including the isolation layer, forming a hard mask pattern exposing a recess region over the first conductive layer, etching the first conductive layer and the substrate using the hard mask pattern as an etch barrier (or etch mask) to form an initial first conductive pattern and a recess, selectively etching the initial first conductive pattern to form a final first conductive pattern over the active region defined on both sides of the recess, forming insulation spacers on a sidewall of the final first conductive pattern, forming a conductive layer for a gate electrode and a gate hard mask layer over the resulting structure including the recess and the final first conductive pattern, and patterning the gate hard mask layer and the conductive layer for the gate electrode to form a gate in a gate region of the substrate.

DESCRIPTION OF SPECIFIC EMBODIMENTS

Figure 1A:
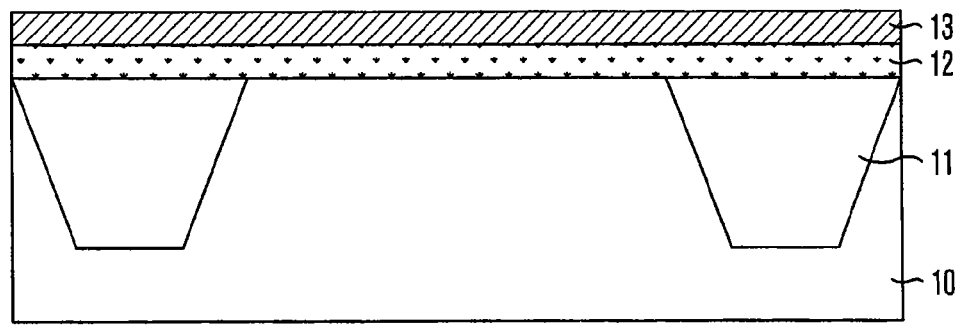
FIGS. 1A to 1J illustrate a method for fabricating a semiconductor device in accordance with an embodiment of the present invention.

Hereinafter, a method for fabricating a semiconductor device in accordance with the present invention will be described in detail with reference to the accompanying drawings.

In the figures, the dimensions of layers and regions are exaggerated for clarity of illustration. It will also be understood that when a layer is referred to as being "on/under" another layer or substrate, it can be directly on/under the other layer or substrate, or intervening layers may also be present. Like reference numerals refer to like elements throughout the drawings. In addition, changes to the English characters of the reference numerals of layers refer to a partial deformation of the layers by an etch process or a polishing process.

FIGS. 1A to 1J illustrate a method for fabricating a semiconductor device in accordance with an embodiment of the present invention. In particular, a method for fabricating a semiconductor device including a recess gate will be described.

Referring to FIG. 1A, an isolation layer 11 is formed over a substrate 10 to define an active region.

A first conductive layer 12 and a hard mask layer 13 are sequentially formed over the substrate 10 including the isolation layer 11. The first conductive layer 12 may be formed of polysilicon, and the hard mask 13 may be formed of nitride.

Figure 1B:
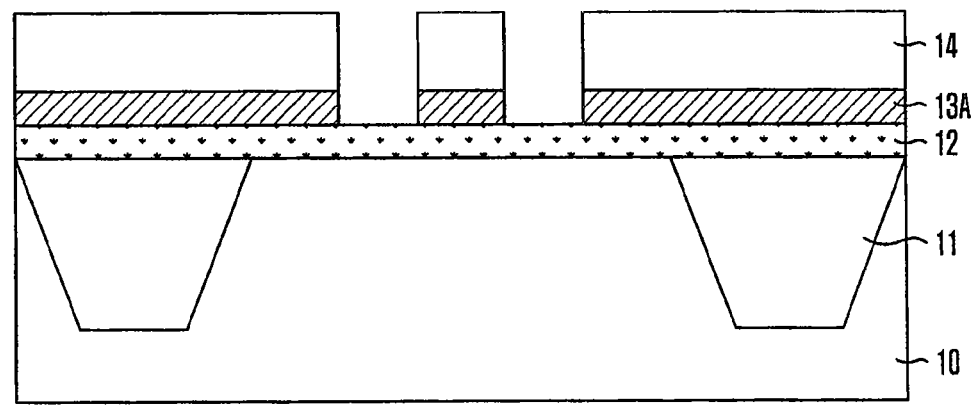

Referring to FIG. 1B, the hard mask layer 13 is etched using a first mask pattern 14 for a recess as an etch mask to form an initial hard mask pattern 13A exposing a recess gate region.

Figure 1C:
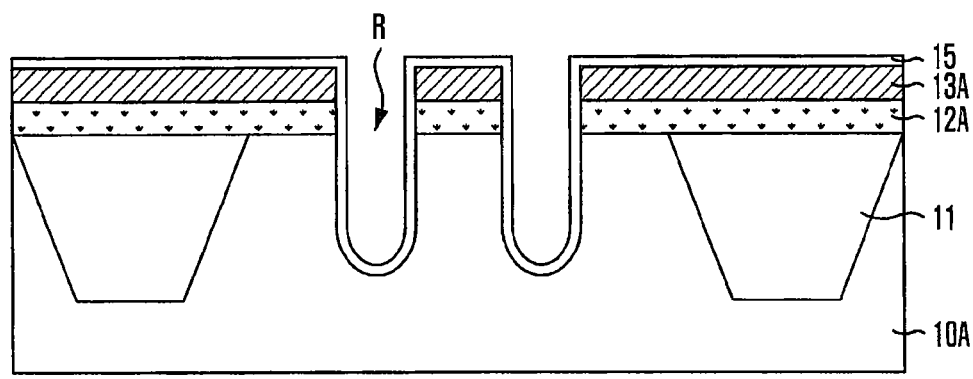

Referring to FIG. 1C, the first conductive layer 12 and the substrate 10 are etched by a predetermined depth using at least the initial hard mask pattern 13A as an etch barrier (or etch mask) to form an initial first conductive pattern 12A and a recess R. This etched substrate is referred to as "etched substrate" denoted as reference numeral 10A.

The first mask pattern 14 is removed, and a gate insulation layer 15 is formed over the resulting structure including the recess R.

Figure 1D:
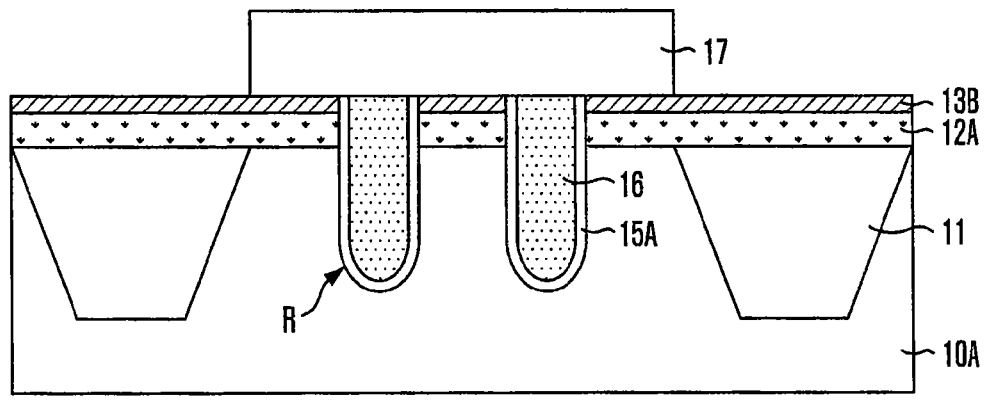

Referring to FIG. 1D, a second conductive layer is formed over the gate insulation layer 15, wherein the second conductive layer includes a gate electrode material. A planarization process (for example, a chemical mechanical polishing (CMP) process) is performed until the initial hard mask pattern 13A is exposed. Thus, second conductive pattern 16 filling the recess R is formed. The second conductive pattern 16 may be formed of polysilicon. Reference numerals 13B and 15A represent primarily planarized hard mask patterns and gate insulation patterns, respectively.

A second mask pattern 17 is formed over the planarized resulting structure. The second mask pattern 17 is formed for a subsequent final first conductive pattern and it may cover the active region of the etched substrtate 10A.

Figure 1E:
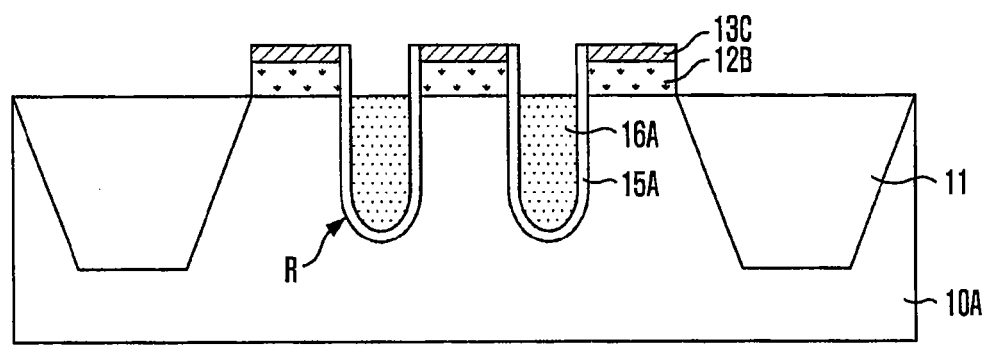

Referring to FIG. 1E, the primarily planarized hard mask pattern 13B and the initial first conductive pattern 12A are etched using the second mask pattern 17 as an etch barrier to form a stacked structure. The stacked structure includes a final first conductive pattern 12B and a primarily etched hard mask pattern 13C on both sides of the recess gate region, that is, a source/drain region.

The second mask pattern 17 is removed, and an etch back process is performed on the second conductive layer 16 up to the bottom of the final first conductive pattern 12B to expose sidewalls of the final first conductive pattern 12B. Thus, etched second conductive patterns 16A are formed.

Figure 1F:
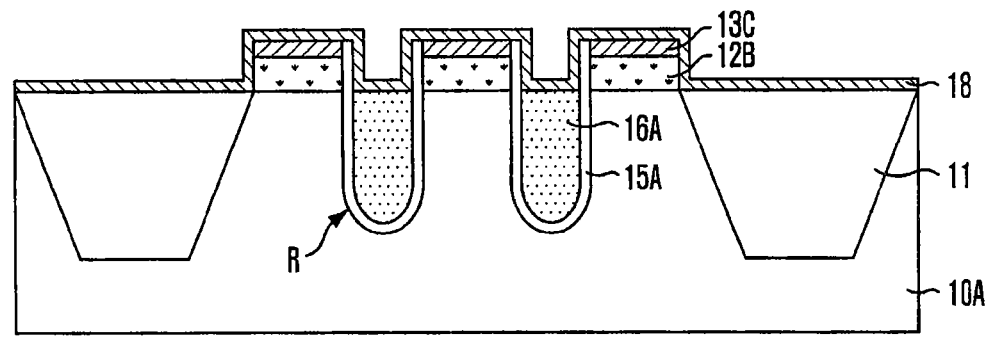

Referring to FIG. 1F, a first insulation layer 18 for spacers is formed over the resulting structure. The first insulation layer 18 for the spacers may be formed of nitride.

Figure 1G:
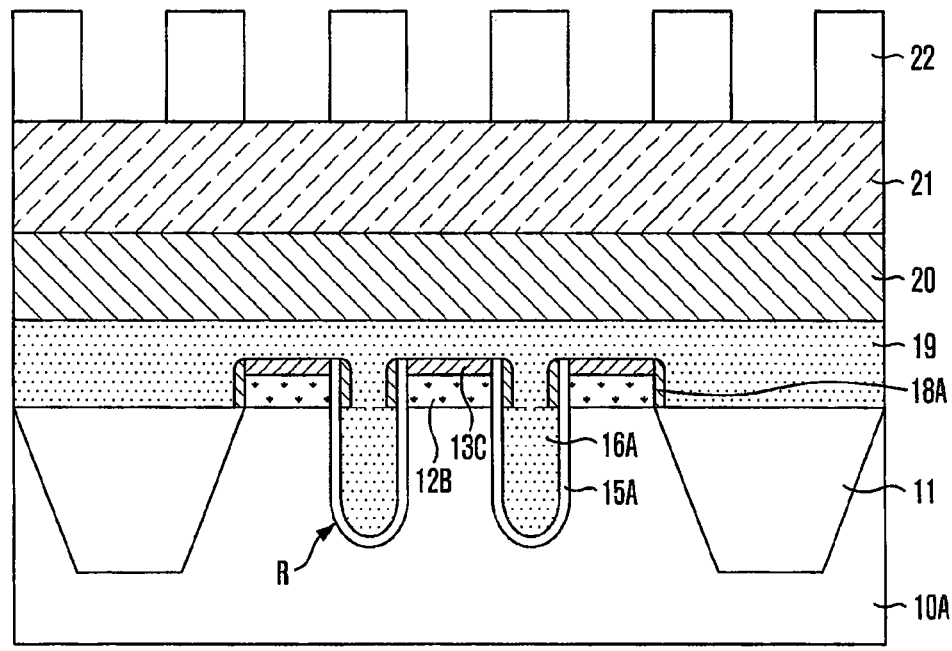

Referring to FIG. 1G, a spacer etch process is performed on the first insulation layer 18 to form spacers 18A on the sidewalls of the final first conductive pattern 12B. The spacers 18A insulate the final first conductive pattern 12B from subsequent gates.

A third conductive layer 19 and a fourth conductive layer 20 are formed over resulting structure including the spacers 18A and are formed of a gate electrode material. A gate hard mask layer 21 is formed over the fourth conductive layer 20. The third conductive layer 19 may be formed of the same material (for example, polysilicon) as the second conductive layer 16, and the fourth conductive layer 20 may be formed of tungsten (W). In addition, the gate hard mask 21 may be formed of nitride.

A third mask pattern 22 for forming a gate pattern is formed over the gate hard mask layer 21.

Figure 1H:
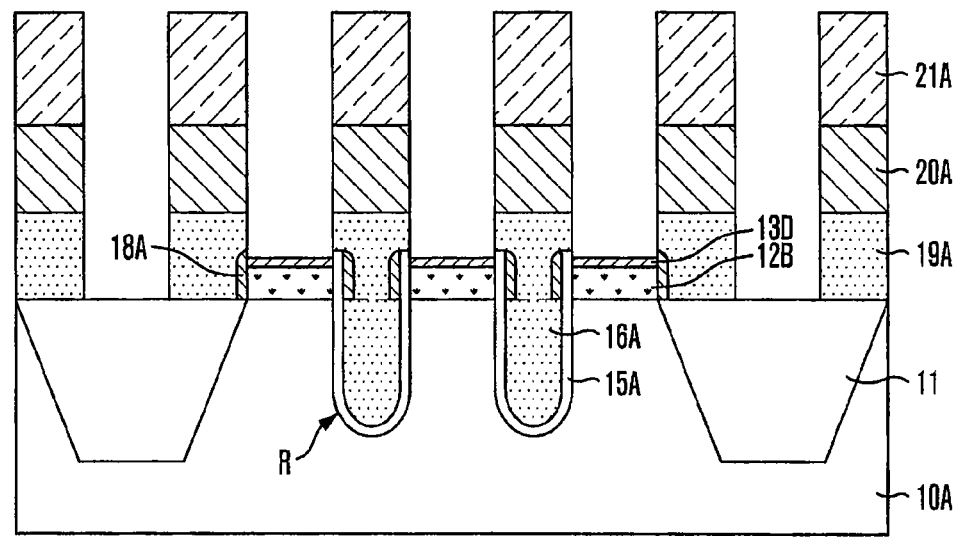

Referring to FIG. 1H, gate patterns are formed by etching the gate pattern hard mask layer 21, the fourth conductive layer 20, and the third conductive layer 19 using the third mask pattern 22 as an etch barrier. The third mask pattern 22 is then removed. The gate pattern includes third conductive pattern 19A, fourth conductive pattern 20A, and gate hard mask pattern 21A.

As a result, the final first conductive patterns 12B having a certain thickness filling a portion of the space between the gate patterns is formed over the active region defined on both sides of the gate pattern. The primarily etched hard mask patterns 13C may be used as an etch barrier during the formation of the gate patterns. Furthermore, the primarily etched hard mask patterns 13C may be partially etched during the formation of the gate patterns, thus secondly etched hard mask patterns 13D are formed. The final first conductive pattern 12B and the gate patterns are insulated from each other by the spacers 18A and the secondly etched hard mask pattern 13D.

Figure 1I:
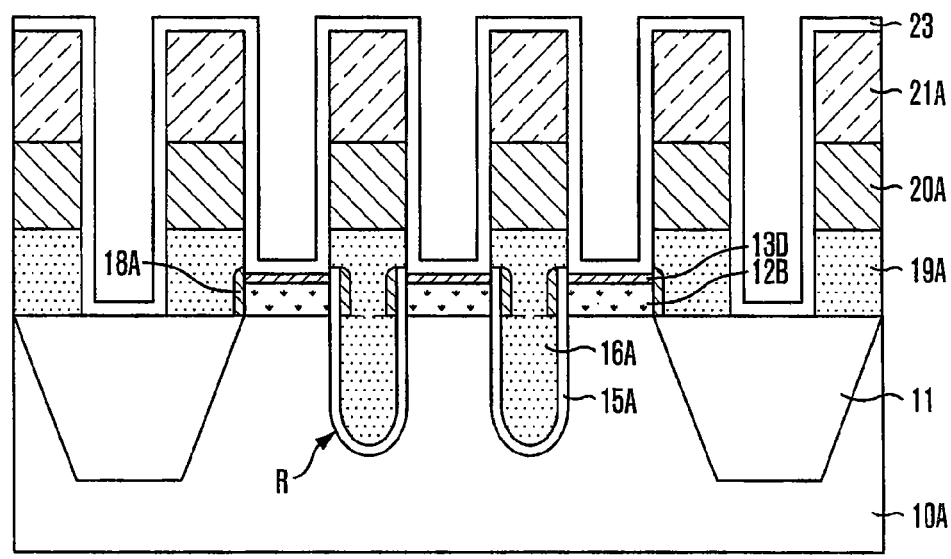

Referring to FIG. 1I, a second insulation layer 23 for gate spacers is formed over the resulting structure including the gate patterns. The second insulation layer 23 for the gate spacers may be formed of nitride.

Figure 1J:
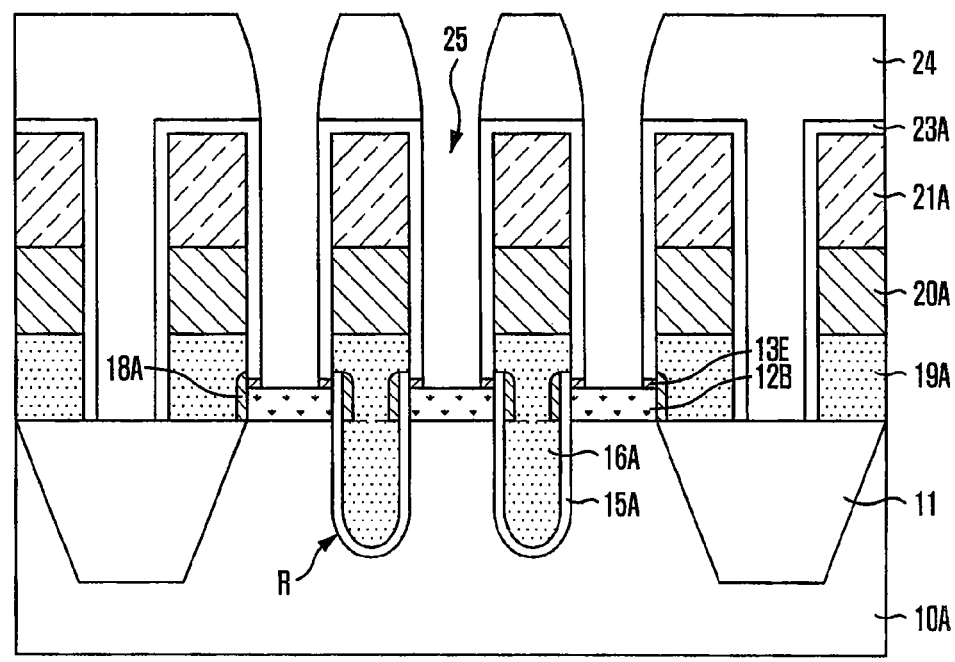

Referring to FIG. 1J, an interlayer insulation layer 24 covering the gate patterns is formed over the second insulation layer 23. A self aligned contact (SAC) etching process is performed on the interlayer insulation layer 24 and the insulation layer 23 in order to form an opening 25 exposing the final first conductive pattern 12B. Reference numerals 13E and 23A represent a final hard mask pattern and a second insulation pattern, respectively.

Although not illustrated, the opening 25 may be filled with a conductive material to form a landing plug contact connected to the final first conductive pattern 12B.

Accordingly, since the etch target decreases due to the final first conductive pattern 12B during the SAC etching process, a "not open fail" of the landing plug contact can be prevented. In addition, since a SAC etching time is reduced, the loss of the gate pattern hard mask 21 decreases, thereby reducing the SAC fail between the landing plug contact and the gate pattern. That is, defects occurring in the landing plug contact process can be minimized without reducing the width of the gate pattern.

As described above, the method for fabricating the semiconductor device in accordance with the present invention can reduce the etch target during the SAC etching process for forming the landing plug contact to thereby prevent the "not open fail" of the landing plug contact and the SAC fail between the landing plug contact and the gate and improve the fabrication yield of the semiconductor device.

While the present invention has been described with respect to the specific embodiments, the above embodiments of the present invention are illustrative and not limitative. It will be apparent to those skilled in the art that various changes and modification may be made without departing from the spirit and scope of the invention as defined in the following claims.

What is claimed is:

1. A method for fabricating a semiconductor device, the method comprising:

forming an isolation layer defining an active region over a substrate;

forming a conductive layer over the substrate including the isolation layer;

patterning the conductive layer to form a conductive pattern over the active region defined on first and second sides of a gate region and to form a recess with a predetermined depth in the substrate;

forming insulation spacers on a sidewall of the conductive pattern;

forming a conductive layer for a gate electrode and a gate hard mask layer over the resulting structure including the conductive pattern; and patterning the gate hard mask layer and the conductive layer to form a gate in the gate region of the substrate.

2. The method of claim 1, wherein the conductive layer comprises a polysilicon layer.

3. The method of claim 1, wherein the gate and the conductive pattern are insulated from each other by the insulation spacers.

4. The method of claim 1, wherein the conductive pattern comprises an insulation pattern thereon.

5. The method of claim 1, further comprising, after forming the gate:

forming a insulation layer for a gate spacer over the resulting structure including the gate;

forming an interlayer insulation layer over the insulation layer for the gate spacer;

performing a self aligned contact (SAC) etching process on the interlayer insulation layer and the insulation layer for the gate spacer to form an opening exposing the conductive pattern; and filling the opening with a conductive material.

6. A method for fabricating a semiconductor device, the method comprising:

forming an isolation layer defining an active region over a substrate;

forming a first conductive layer over the substrate including the isolation layer;

forming a hard mask pattern exposing a recess region over the first conductive layer;

etching the first conductive layer and the substrate using the hard mask pattern as an etch mask to form an initial first conductive pattern and a recess;

selectively etching the initial first conductive pattern to form a final first conductive pattern over the active region defined on both sides of the recess;

forming insulation spacers on a sidewall of the final first conductive pattern;

forming a conductive layer for a gate electrode and a gate hard mask layer over the resulting structure including the recess and the final first conductive pattern; and patterning the gate hard mask layer and the conductive layer for the gate electrode to form a gate in a gate region of the substrate.

7. The method of claim 6, wherein the first conductive layer comprises a polysilicon layer.

8. The method of claim 6, further comprising, after forming the initial first conductive pattern and the recess:

forming a second conductive layer over the resulting structure including the initial first conductive pattern and the recess; and planarizing the second conductive layer until the hard mask pattern is exposed.

9. The method of claim 8, wherein the forming of the final first conductive pattern comprises:

forming a mask pattern covering the active region of the substrate over the planarized second conductive layer and the hard mask pattern; and etching the hard mask pattern and the initial first conductive pattern using the mask pattern as an etch mask.

10. The method of claim 9, further comprising, after forming the final first conductive pattern, performing an etch back process on the second conductive layer up to the bottom of the final first conductive pattern to expose a sidewall of the final first conductive pattern.

11. The method of claim 6, wherein the gate and the final first conductive pattern are insulated from each other by the insulation spacers.

12. The method of claim 6, further comprising, after forming the gate:

forming a insulation layer for a gate spacer over the resulting structure including the final first conductive pattern and the gate;

forming an interlayer insulation layer on the insulation layer for the gate spacer;

performing a SAC etching process on the interlayer insulation layer and the insulation layer for the gate spacer to form an opening exposing the final first conductive pattern; and filling the opening with a conductive material.

* * * * *